United States Patent
Wang et al.

(10) Patent No.: US 7,391,193 B2
(45) Date of Patent: *Jun. 24, 2008

(54) VOLTAGE REGULATOR WITH BYPASS MODE

(75) Inventors: Yongliang Wang, Saratoga, CA (US); John Pasternak, Santa Clara, CA (US)

(73) Assignee: Sandisk Corporation, Milpitas, CA (US)

( * ) Notice: Subject to any disclaimer, the term of this patent is extended or adjusted under 35 U.S.C. 154(b) by 269 days.

This patent is subject to a terminal disclaimer.

(21) Appl. No.: 11/042,610

(22) Filed: Jan. 25, 2005

(65) Prior Publication Data

US 2006/0164054 A1 Jul. 27, 2006

(51) Int. Cl.
*G05F 1/40* (2006.01)
*G05F 1/10* (2006.01)
*H02H 3/20* (2006.01)

(52) U.S. Cl. .................. 323/282; 327/541; 361/18

(58) Field of Classification Search .............. 323/282, 323/284, 285, 299; 361/18; 327/525, 538, 327/541, 540; 365/189.09, 226
See application file for complete search history.

(56) References Cited

U.S. PATENT DOCUMENTS

| | | | |
|---|---|---|---|
| 4,373,117 A | 2/1983 | Pierce | |
| 5,121,007 A | 6/1992 | Aizaki | |
| 5,327,388 A | 7/1994 | Kobayashi | |
| 5,329,491 A | 7/1994 | Brown et al. | |
| 5,373,477 A | 12/1994 | Sugibayashi | |
| 5,490,117 A | 2/1996 | Oda et al. | |
| 5,566,121 A | 10/1996 | Hadderman et al. | |
| 5,602,462 A | 2/1997 | Stich et al. | |
| 5,615,328 A | 3/1997 | Hadderman et al. | |
| 5,625,280 A | 4/1997 | Voldman | |
| 5,632,039 A | 5/1997 | Walker et al. | |
| 5,696,465 A | 12/1997 | Ishizuka | |
| 5,814,980 A | 9/1998 | Lewis | |
| 5,818,781 A | 10/1998 | Estakhri et al. | |
| 5,894,244 A | 4/1999 | Ukita | |
| 5,903,501 A | 5/1999 | Kurosaki | |
| 5,909,586 A | 6/1999 | Anderson | |
| 5,973,521 A | 10/1999 | Kim et al. | |
| 6,005,819 A * | 12/1999 | Shin ........................... | 365/226 |
| 6,028,755 A * | 2/2000 | Saeki et al. ................ | 361/91.1 |
| 6,163,170 A | 12/2000 | Takinomi | |

(Continued)

FOREIGN PATENT DOCUMENTS

EP    1 056 206 A1    11/2000

*Primary Examiner*—Adolf Berhane
(74) *Attorney, Agent, or Firm*—Vierra Magen Marcus & DeNiro LLP

(57) ABSTRACT

A step down voltage regulator with bypass comprised of devices designed to operate over a maximum rated voltage lower than a supply voltage. The regulator includes an output regulation device coupled to the supply voltage and an output. An output device protection circuit is provided which is responsive to the supply voltage and the output to ensure that the maximum rated voltage of the output regulation device is not exceeded. A bypass circuit having a bypass output device and being coupled to the supply voltage is provided with a protection circuit. The output regulation devices comprise p-channel transistors, and may have an operating maximum rated voltage in a range of 2.7-3.6 volts with the supply voltage is in a range of 4.4-5.25 volts, or 2.9-3.5 volts.

33 Claims, 5 Drawing Sheets

U.S. PATENT DOCUMENTS

| | | |
|---|---|---|
| 6,181,118 B1 | 1/2001 | Meehan et al. |
| 6,198,683 B1 | 3/2001 | Ishii et al. |
| 6,351,180 B1 * | 2/2002 | Sher et al. .................. 327/541 |
| RE37,593 E | 3/2002 | Etoh et al. |
| 6,420,924 B1 | 7/2002 | Lundberg |
| 6,462,992 B2 | 10/2002 | Harari et al. |
| 7,164,561 B2 * | 1/2007 | Wang et al. .................. 361/18 |
| 7,212,067 B2 | 5/2007 | Pasternak |
| 2002/0157039 A1 | 10/2002 | Ihara |
| 2003/0132733 A1 | 7/2003 | Hijikata |

* cited by examiner

When VIN_53 is 3V

VIN_53 is 5V

VOLTAGE REGULATOR WITH BYPASS MODE

BACKGROUND OF THE INVENTION

1. Field of the Invention

The present invention is directed to voltage regulation in multi-voltage supply applications, and in particular, for peripheral devices such as memory systems.

2. Description of the Related Art

Advances in integrated circuit (IC) technology often relate to decreasing the size and operating voltages of devices used to fabricate circuitry. Lower power devices generally translate into lower costs due to decreases in circuit size and power consumption. Currently, low-voltage integrated circuits having transistors operating in the three-volt range and lower are highly desirable. The three-volt ICs are gradually replacing the standard five-volt ICs due to their higher speed and higher integration densities. Moreover, the three-volt ICs consume less power than the traditional five-volt ICs. In battery operated devices, such as portable telephones and lap-top computers, low-voltage integrated circuits allow the devices to operate proportionally longer than devices requiring higher voltage for operation.

Improvements in processing technology have led to smaller transistor device sizes. This in turn has led to lower power supply requirements in each successive generation of transistor technology. For example, a 0.25 micron process device operates on a voltage of approximately 2.5 volts, a 0.18 micron process uses a 1.8v (+/−10%) supply, a 0.15 micron process will use a 1.5 (+/−10%) volt supply, 0.13 micron technology a 1.2v (+/−10%) supply, and so on.

The lower power requirements of newer semiconductor processes are not always compatible with legacy host devices. For example, older hosts may supply 5 or 3 volts to a memory system requiring only 3 or 1.8 volts, respectively. Computer peripheral devices must therefore be designed to accommodate connections from both 3.3 volt host supplies as well as older, higher voltage supplies. Devices constructed with newer technologies therefore allow for the possibility that the host device in which they are used will supply a higher voltage used with legacy products. Hence power level detection and voltage regulation techniques are used to provide the correct voltage to the memory device.

One such peripheral device which must make such adjustments is non-volatile memory which might be used in cellular telephones, digital cameras, personal digital assistants, mobile computing devices, non-mobile computing devices, audio and video players and other appliances. Electrical Erasable Programmable Read Only Memory (EEPROM) and flash memory are among the most popular non-volatile semiconductor memory types.

Non-volatile memory may be coupled to a host device in a number of ways. Peripheral adapters include integrated adapters coupled directly to a computers system bus and power supply, and peripherals adapted to connect to any of a number of industry standard external system connections, such as Universal Serial Bus or the IEEE 1394 Standard. A common interface used to couple non-volatile memory to such devices is the Universal Serial Bus interface. Many current USB devices are designed to operate at 3 volt, but may receive a supply in the 3 volt or 5 volt range from legacy devices.

Generally, in order to couple peripherals manufactured with newer process technologies to legacy or hosts providing higher-supply voltages, step-down voltage regulators are used. Where the regulator is integrated with the peripheral, it would be desirable to manufacture the regulator using the same process technology as that used to manufacture devices in the peripheral. Generally, however, this is not possible, since the input load to the regulator can damage lower voltage devices.

Co-pending application Ser. No. 10/633,110 discloses a voltage regulator which regulates a 5 volt supply to a 3 volt output with 3 volt devices. The devices are protected by a protection circuit within the device, allowing the device to operate with an input voltage greater than the operating level of the devices without damaging the devices.

The present invention provides an alternative implementation of a voltage regulator wherein devices having an operating range lower than the potential input voltages are used in the voltage regulator.

SUMMARY OF THE INVENTION

These and other objects and advantages of the present invention will appear more clearly from the following description in which the preferred embodiment of the invention has been set forth in conjunction with the drawings.

In one embodiment, the invention is a step down voltage regulator comprising devices designed to operate over a maximum rated voltage lower than a supply voltage. The regulator includes an output regulation device coupled to the supply voltage and an output. An output device protection circuit is provided which is responsive to the supply voltage and the output to ensure that the maximum rated voltage of the output regulation device is not exceeded. In addition, a bypass circuit having a bypass output device and being coupled to the supply voltage may be provided. The bypass circuit includes protection circuitry enabled when the supply is at said maximum rated voltage. In one embodiment, the output regulation device comprises a p-channel transistor, and may have an operating maximum rated voltage in a range of 2.7-3.6 volts with the supply voltage is in a range of 4.4-5.25 volts.

In another embodiment, the invention is a voltage regulator supplying an output voltage lower than a supply voltage. The regulator includes a first output device and a second output device, each designed to operate at a maximum rated voltage lower than the supply voltage. Protection circuitry coupled to the first output device and the second output device is provided to regulate a gate voltage of the first and second output devices relative to a drain load and a source voltage on the output devices so as to not exceed the maximum rated voltage. In addition, a voltage detector is provided which is coupled to the supply voltage and at least the second output device, enabling the second output device when the supply voltage is at a voltage less than a maximum operating voltage for the first and second output devices. In a further embodiment, the second output device is a p-channel transistor having a lower output resistance than said first output device, and may be several times greater in size than the first output device.

In a further embodiment, the invention is a memory system including a control path and a data path to a host device, and receiving a supply voltage from the host device. The subsystem includes a voltage regulator including a voltage input coupled to the supply voltage; an output device having a maximum device operating voltage less than a maximum possible supply voltage and coupled to a regulator output; a bypass device having a maximum device operating voltage less than a maximum possible supply voltage and coupled to a regulator output; a protection circuit coupled to the voltage input, the bypass device and the output device, the protection circuit comprising a plurality of output control devices operating at maximum rated voltages less than the voltage provided by the host at the input; and a voltage detector coupled to the supply voltage outputting a signal indicating whether a level of the supply voltage.

In yet another embodiment, the invention is a memory system having a controller, a memory array, and a voltage regulator. The voltage regulator may include a plurality of devices operating at maximum rated voltages less than a supply voltage and having an output regulation device coupled to the supply voltage and an output. The system includes an output device protection circuit responsive to the supply voltage and the output to ensure that the maximum rated voltage of the output regulation device is not exceeded. The system may also include a bypass circuit having a bypass output device and being coupled to the supply voltage, the bypass circuit including protection circuitry enabled when the supply is at said maximum rated voltage.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

The invention provides a regulated voltage for operating a device coupled to a host when the host supply exceeds that necessary device operation, and a bypass mode, allowing the supply to pass to the device directly when the supply voltage is sufficient to power the device. The invention is implemented with transistors or other devices which are designed to operate at maximum rated voltages lower than the potential maximum supply voltage of the host. The invention ensures that the potentially higher-than-necessary host supply voltages do not damage the peripheral or the voltage regulator.

In one embodiment, the invention is suitable for use with a non-volatile memory system. However, the invention has myriad uses not limited to memory systems. The system may be utilized with any number of types of host devices such as cellular telephones, digital cameras, personal digital assistants, mobile computing devices, non-mobile computing devices and other devices. One typical host device is a computer system. It should be recognized that the system shown in FIG. 1 is exemplary and any number of devices may serve as hosts for the peripheral, including digital cameras, music players, computers, and the like.

Figure 1:
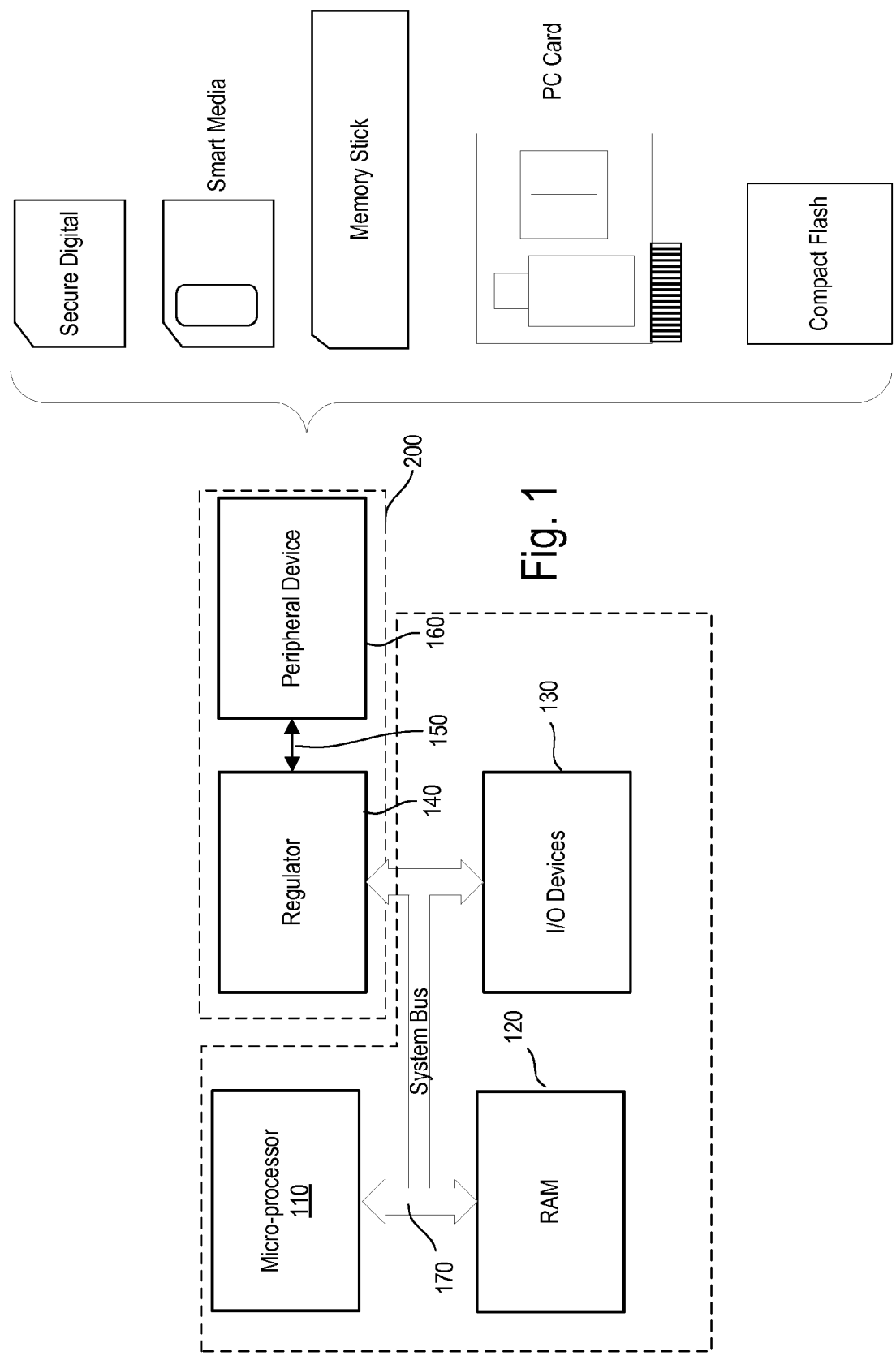
FIG. 1 depicts a general-purpose computer system which may constitute a host for a peripheral device incorporating the techniques of the present invention.

An exemplary general purpose computer system which may serve as a host and in which the various aspects of the present invention may be incorporated is illustrated generally in FIG. 1. A typical computer system architecture includes a microprocessor 110 connected to a system bus 170, along with random access, main system memory 120, and at least one or more input-output devices 130, such as a keyboard, monitor, modem, and the like. Generally, one or more non-volatile storage systems are coupled to the system bus 170 as well. Typically, such a memory is a disk drive and the data stored thereon is retrieved into the system volatile memory 120 for use in current processing, and can be easily supplemented, changed or altered.

A peripheral device 200 is also coupled to the computer. The peripheral may be coupled to receive data signals from the system bus 170, and a power supply voltage from the computer's power supply (not shown). The peripheral includes a voltage regulator 140 providing regulated power to a functional component 160, such as a memory card, of the peripheral device 200. In one example, where the peripheral is a storage memory system, the system may be constructed of a memory controller, connected to the computer system bus, and a memory array, which may be comprised of EEPROM integrated circuit chips. Where the peripheral is a memory system, the controller is preferably formed primarily on a single integrated circuit chip and the memory array may include a number of EEPROM integrated circuit chips. The memory system may be provided in the form of a pc card, a compact flash card, a secure digital card, a smart media card, a memory stick, USB flash drive, or other physical forms. Data and instructions are communicated from the computer to the peripheral device over a data line.

Figure 2:
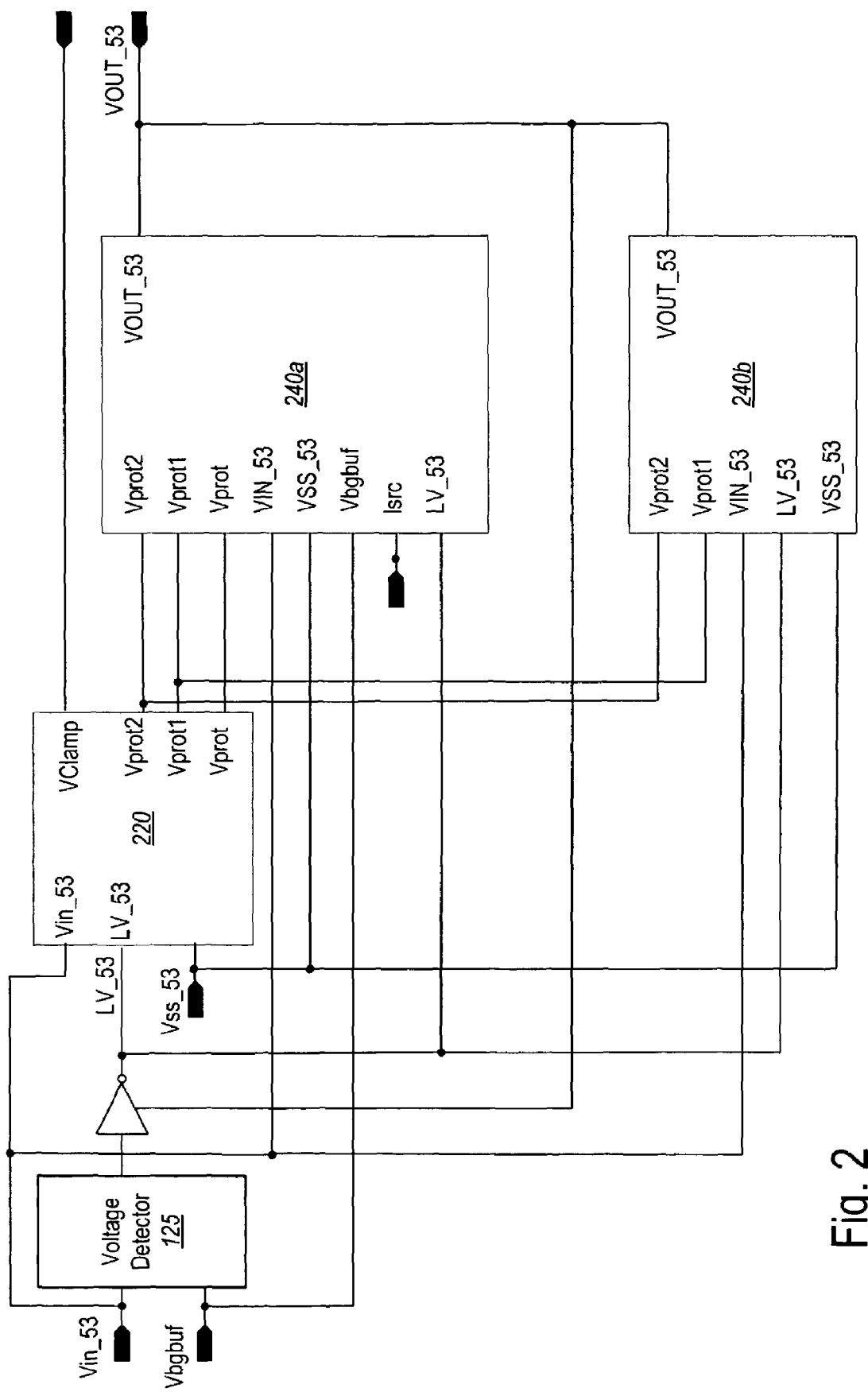
FIG. 2 is a block diagram of a voltage regulator formed in accordance with the present invention.

A voltage regulator 140 in accordance with the present invention is shown in FIG. 2. The regulator 140 includes a clamp circuit 220 and regulator circuits 240a and 240b. Also shown in a voltage detector 125. Regulator 140 receives as input voltage Vin_53 and Vss_53 which are provided by the host device or other voltage source. In general Vin_53 will be in either a 3 volt range of approximately 2.9 volt to 3.5 volts, or a 5 volt range of approximately 4.4 volts to 5.25 volts, while Vss_53 will be at ground. Also shown in FIG. 2 are the band gap buffer voltage Vbgbuf and a bias current (isrc). Vbgbuf and isrc may be generated by the peripheral device. Vgbuf will have a range of between 1.3 and 1.5 volts, while Isrc provides approximately 2.5 microamps.

Voltage detector 125 provides a level detector output LV_53 which indicates whether the voltage level of Vin_53 is above or below a threshold. If Vin_53 is in a "5 Volt range", such as for example 4.4-5.25 volts, the output of LV_53 is a logic level "low" signal (on the order of 4.4 volts to 5.25 volts). If Vin_53 is in a "3 volt range", (such as, for example 2.9 to 3.3), the output of LV_53 will be a logic level "high" output in the range of 2.9 to 3.5 volts. The output of detector 125 is gated by buffer 127. Buffer 127 is enabled by the output of the regulator Vout_53. This ensures protection in the ramping of Vin_53 in that the regulators circuits are always "on" (providing a regulated output voltage) such that regulator circuit bypass cannot occur until the input voltage Vin_53 has propagated through the circuits.

Clamp circuit 220 uses Vin_53 and LV_53 to generate control signals (Vprot, Vprot1, Vprot3) which allow the regulator circuits to provide a regulated output Vout_53. Regulators 240a and 240b are controlled depending on the input voltage Vin_53 as reflected by LV_53.

In application Ser. No. 10/633,110, a single protected output stage is used. In accordance with the present invention, two regulator stages 240a, 240b are provided in order to implement a low output resistance in bypass mode. In regulated mode, stages 240a operates to reduce a 5 volt range input at Vin_53 to a 3 volt output; in a bypass mode, a 3 volt range input is passed to the regulator output by stages 240a and 240b concurrently.

In general, if Vin_53 is in a 5 volt range, regulator 240a is on and regulator 240b is off. Where Vin_53 is in a 3 volt range, the regulator 140 is in a bypass mode—that is, Vin_53 is passed through output devices in both circuits 240a and 240b to Vout_53. The signals Vprot, Vprot1, Vprot3 are used to protect the individual devices comprising regulators 240a and 240b, and hence allow the regulators to be constructed using 3 volt devices. Additional details of the regulators 240a, 240b and clamp circuit 220 are described below with respect to FIG. 3.

Figure 3:
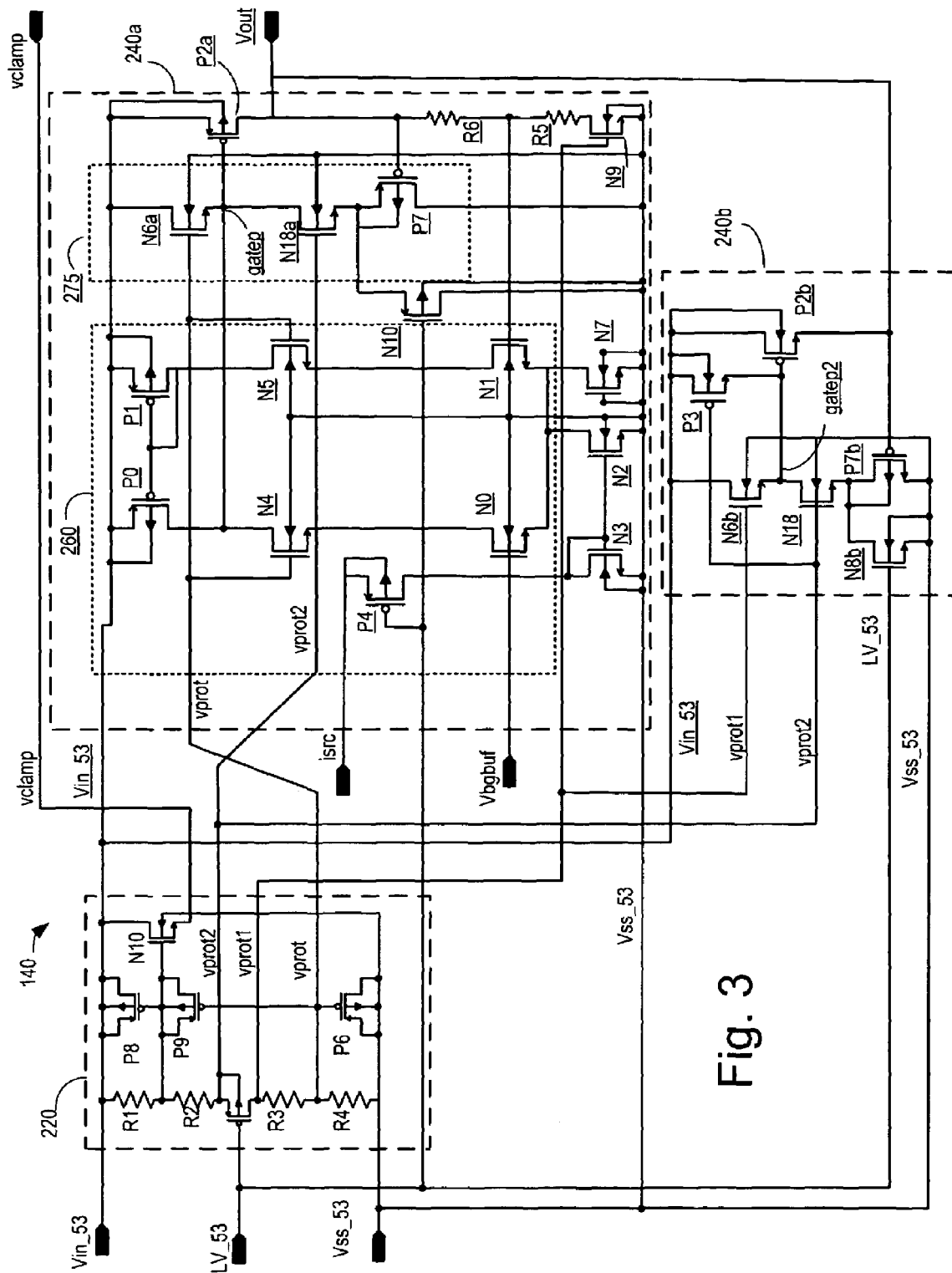
FIG. 3 is a schematic diagram of a voltage regulator formed in accordance with the present invention.

FIG. 3 is a schematic view of the clamp circuit, and voltage regulator circuits. In one embodiment, all transistors in the circuit shown in FIG. 3 are "3 volt" devices. That is, each of the transistors has a maximum rated operating voltage of 3.6 volts. In accordance with the foregoing description, to reduce the maximum rated voltages, transistor designers have altered channel lengths and reduced oxide thicknesses. Were the supply voltage of Vin_53 at a level between 4.4 and 5.3 volts allowed to impact the gates of the devices directly, damage to the devices would result. Hence, the circuits of the present invention utilize a protection scheme for each of the elements in the circuit, as well as the output devices P2a and P2b shown in FIG. 3, to insure that the 3 volt devices used in the regulator are not damaged by the higher input voltage. As will be readily recognized by one of average skill in the art, this protection scheme can be extended beyond the 5 volt step-down to 3 volt embodiment, to other applications.

Referring to FIG. 3, the host input voltages Vin_53 and Vss_53 are provided to clamp circuit 220. Also provided from the host is signal LV_53, which indicates whether clamp circuit 220 includes a resistive divider and capacitive divider which provide four outputs: Vclamp is an unregulated analog output voltage in the range of 3.3 volts, and Vprot, Vprot1 and Vprot2 which are three "protect" control voltages used by the regulator circuits to provide protection for the active devices therein. Vclamp is allowed to pass through the regulators to the peripheral device for use in unregulated analog power needs. Likewise Vin_53 passes through the clamp circuit 220 to the regulators 240a and 240b.

Clamp circuit 220 comprises a resistive divider made up of resistors R1 through R4 and a capacitive divider made up of p-channel MOSFETs P6, P8, and P9. The capacitive divider allows the four outputs Vprot, Vprot1, Vprot2 and Vclamp to be provided at the same time to the regulator circuit 240. In one embodiment, resistor R1 has a value of 125 k ohms, resistor R2 has a value of 50 k ohms, resistor R3 a value of 60 k ohms, and resistor R4 a value of 290 k ohms. P-channel MOSFET P8 has a commonly coupled base, source and drain, as does device P9, with the gate of device P8 coupled to the base of device P9 and the gate of P9 coupled to the gate of device P6 and the tap between resistors R3 and R4. The base, source and drain of P6 are coupled to Vss_53, and the base of output transistor N10. Device N10 has a drain coupled to Vin_53, and its a gate coupled to the tap between resistors R1 and R2.

In one embodiment, the clamp circuit operates with a current of 10 microamps, and the outputs of Vprot, Vprot1, and Vprot2 are provided by the outputs of the resistive divider as should be well understood by one of average skill. Vprot1 and Vprot2 are coupled to p channel device P3. Vprot is provided by a tap between resistors R3 and R4. Vclamp is a controlled voltage provided by enabling the voltage across N10 using the tap between resistors R1 and R2.

Since power provided from Vin_53 can ramp rapidly, the capacitive divider coupled MOSFETS P6, P8 and P9 respond to protect gate stress on transistor N10 and ensure that Vprot, Vprot1, Vprot2 and Vin_53 are delivered concurrently.

Note that clamp circuit 220 is controlled by LV_53 which is coupled to the gate of device P13. If LV_53 is high (indicating a Vin_53 is in the 3 volt range), its output will be approximately 3 volt, enough to effectively shut P13 off. Vprot2 will be pulled to Vin_53, and Vprot1 and Vprot2 will be pulled to ground. These outputs in turn, affect elements of the regulators 240a and 240b, as discussed below. If LV_53 is low (indicating Vin_53 is in the 5 volt range), it will be at ground. Device P13 conducts source to drain, and effectively shorts the connection between Vprot1 and Vprot2.

In the 5 volt range, the Vin_53 is in a range of about 4.4-5.5 volts. The gate voltage at N10 is in a range of about 3.3-4 volts, with the drain voltage at 4.4-5.5 volts. When Vin_53 is 4.4 volts, the output of Vclamp will be approximately 2.86 volts, Vprot1/Vprot2 will be approximately 2.65 volt and Vprot will be 2.43 volts. When Vin_53 is 5.2 volts, Vclamp will be 3.43 volts, Vprot1/Vprot2 will be 3.45 and Vprot will be 2.9 volts. As noted above, when Vin_53 is in a 3 volt range, Vprot and Vprot1 will be at ground, Vprot2 will be approximately 3 volts and Vclamp will be approximately 2.5 volts.

Regulator stage 240a is comprised of a differential pair 260 and an output protection circuit 275. The output protection circuit is coupled to an output regulation device P2a. In accordance with the present invention, the protection circuit 275 controls the voltage at node gateP to ensure that the maximum rated voltage of transistor P2a is not exceeded. Since all of the devices in the differential pair circuit 260 and protection circuit 275 are 3 volt devices, all such devices must be protected from excessive voltage across the devices as well.

Device P2a is a p-channel MOSFET having its base and source coupled to Vin_53, and a drain providing the output Vout_53 of the regulator. It too, has a maximum rated voltage of approximately 3.6 volts and because it is the output device, is key to ensuring reliability in the regulator. Differential pair circuit 260 includes n-channel MOSFETS N4 and N5, n-channel MOSFETS N0, N1, and p-channel MOSFETS p0 and p1. The drain of transistor N4 provides the voltage which controls the output device P2 at node gateP. Devices N1, N0, N4 and N5 have commonly coupled bases with the gates of transistors N4 and N5 coupled to Vprot. The bases and sources of transistors P0 and P1 are coupled to Vin_53, their gates coupled in common. Because transistors P0 and P1 are coupled in a diode configuration, with commonly coupled gates, their source to gate voltage is self-protecting. The output of Vprot will generally be in a range of 2.4 to 2.9 volts. P0 is protected by P1 due to the fact that they share the same gate.

Transistors N4 and N5 each have gates coupled to Vprot, thereby ensuring that the voltage across the gate-source and gate drain interfaces in transistors N4 and N5 is sitting in the relative middle between the Vin_53 and Vss_53. Transistors N0 and N1, each having bases coupled to Vss_53, sources coupled to the current generator N2, and drains coupled to the source of N4 and N5, are protected by transistors N4 and N5. Transistors N2 and N3 provide a bias current for the differential pair circuit 260.

As noted above, transistor P2a is the output transistor of the regulator 240a. Hence the source of P2a is connected to Vin_53 and its drain provides the output Vout. Its drain output is also connected to provide a output feedback via resistor divider comprised of resistors R6 and R5 who nominal values of 190 k ohms and 140 k ohms. Device N9 has a drain connected to resistor R5 and a source coupled to ground, with its gate controlled by Vprot1.

The protection circuit 275 is comprised of N channel transistors N18a and N6a, and P channel transistor P7. In general, the protection circuit 275 insures that as the input voltage Vin_53 ramps, the node gateP cannot be pulled too high or too low to damage P2*a*. In order to accomplish this, the protection circuit ensures that the voltage on gate of the output transistor P2*a* can never be lower than Vin_53 minus 3.6 volts (the voltage of the devices in the circuit shown in FIG. 2). In a worst case scenario—where no load is provided at Vout_53— the voltage between the gate of transistor P2*a* (gate P) and the output voltage will never be greater than 3.6 volts.

Transistor N6*a* protects P2*a* from excess voltage across its gate-source interface. Devices N18*a* and P7 protect P2*a* from excess voltage across its gate-drain interface. N18*a* has a gate controlled by Vprot2, and a source coupled to the source of P7. P7 has a gate controlled by feedback from Vout. N6*a* has a gate controlled by Vprot.

Also shown in is a bypass enable transistor P4, which effectively disables the voltage path through the differential pair 260 in bypass mode.

Regulator 240*b* also includes an output device P2*b*. Like device P2*a*, device P2*b* is a p-channel MOSFET having its base and source coupled to Vin_53, and a drain providing the output Vout_53 of the regulator (in conjunction with P2*a*). Device P2*b* is designed to provide a lower output resistance than P2*a* when operating in bypass mode. Consequently, P2*b* is larger in size than P2*a*. The size differential is based on a given design specification for the regulator an the product in which the regulator is to be utilized, and the difference in size depends on such specification. One of average skill will recognize that the difference in size between the two devices can vary widely. In an exemplary embodiment, P2*b* is several times greater than P2*a*, and in one case is three or more times larger in size than P2*a*.

Regulator 240*b* includes protection circuitry for P2*b* as well, comprising devices P3, N18*b* and N6*b*. Devices N8*b* and P7*b* latch the LV_53 signal, as described below. Devices N18*b* and P3 have their gates coupled to Vprot2 while N6*b* is controlled by Vprot1. The drain of P3 is coupled to Vin_53, and the source to the gate of P2*b*. Devices N8*b* and P7*b* comprise a latch for the LV_53 signal.

Device P2*b* is protected by ensuring that its gate to drain and gate-to-source voltage will never exceed the 3 volt threshold voltage. When Vin_53 is in the 5 volt range, Vprot2 will have an output of approximately 2.2-3.3 volts (being tapped from the middle of the resistor divider). Because Vprot2 will always be in a range of about 2.2-3.3 volts, the gate of P3*b* will be between the 5 volt maximum voltage it may see at its source, and ground seen at its drain, ensuring that the gate to source and gate to drain voltage never exceeds the operating voltage of the device.

Figure 4:
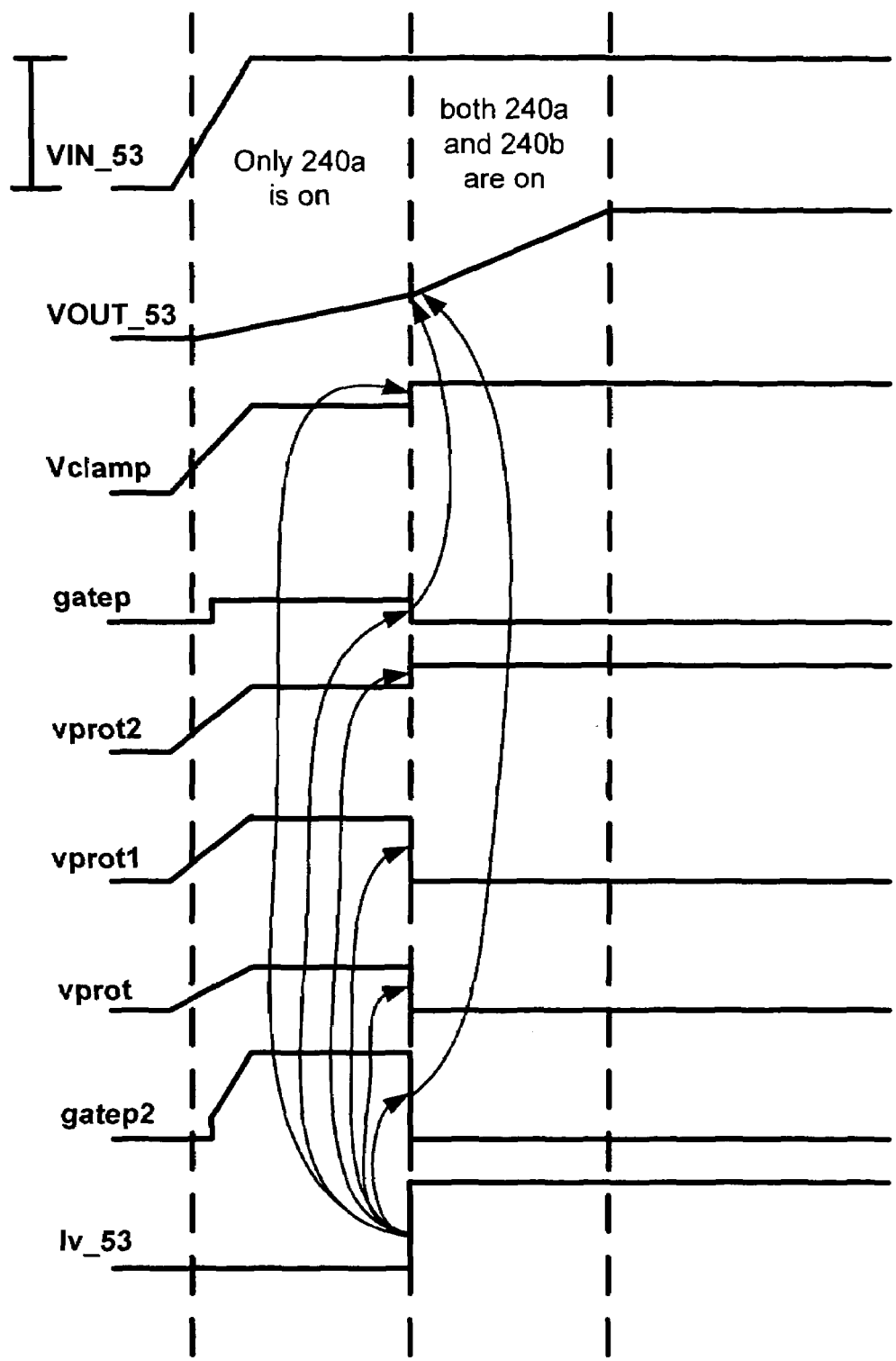
FIG. 4 is a simulation of voltages applied to various nodes of the circuit of FIG. 3 with respect to time when the regulator receives a 3 volt input supply.
Figure 5:
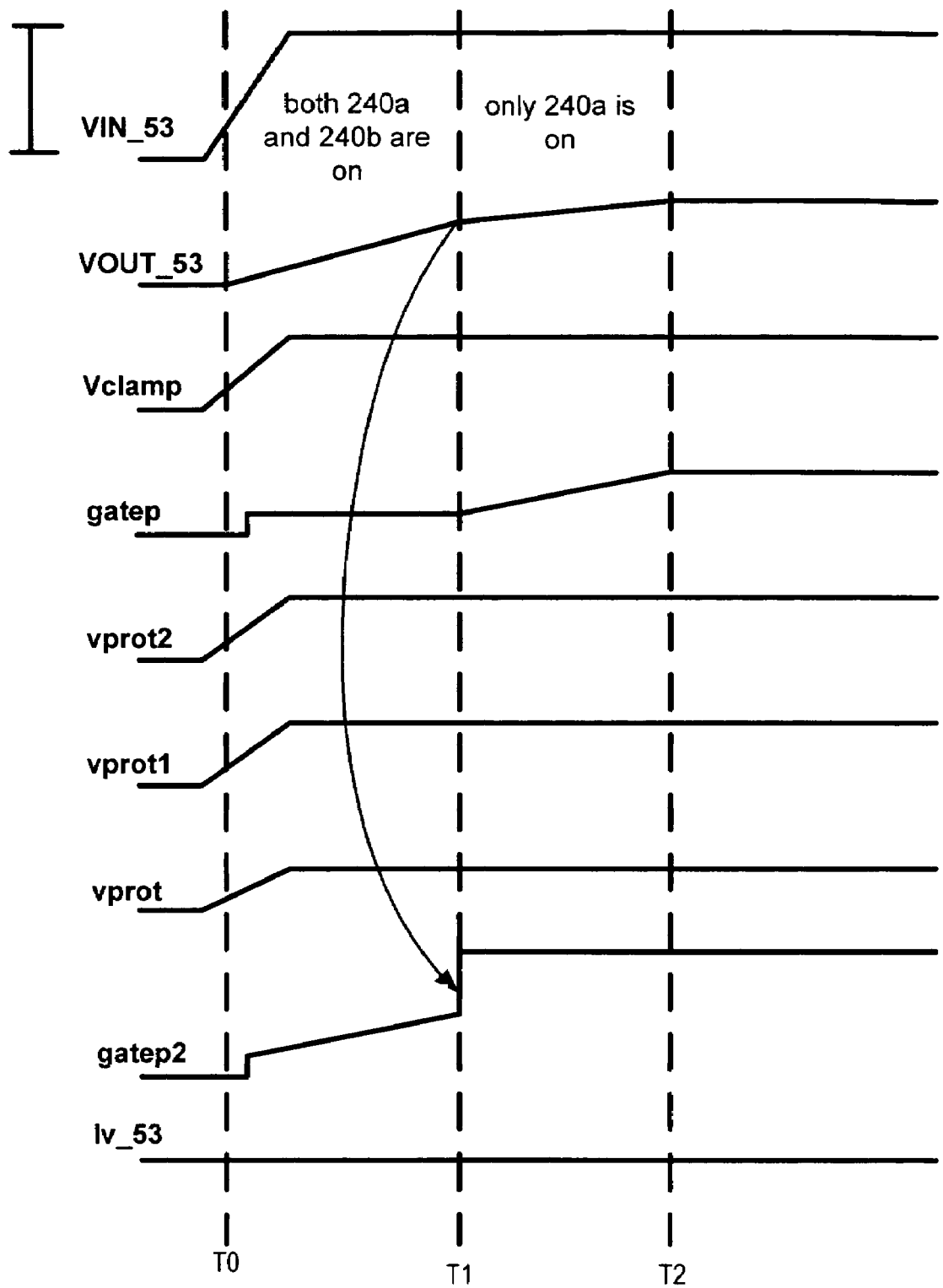
FIG. 5 is a simulation of voltages applied to various nodes of the circuit of FIG. 3 with respect to time when the regulator receives a 5 volt input supply.

Operation of the regulator 140 under 3 volt and 5 volt operating input voltages will be discussed with reference to FIGS. 3, 4 and 5. FIGS. 4 and 5 show the relationship between LV_53, Vin_53, Vprot, Vprot1, Vprot2 and the output Vout_53, as well as well as the voltages at gateP and gateP2 of the regulator circuit 140 in each both 3 volt and 5 volt range operation, respectively.

FIG. 4 shows operation of the regulator in a 3 volt range by displaying the relative voltage levels of Vin_53, Vout_53, Vclamp, gateP, Vprot, vprot2, gateP2 and LV_53 in relation to Times T0, T1 and T2. At time T0, the input voltage Vin_53 begins to ramp up. Initially, LV_53 is low, indicating no detection of a 3 volt signal has yet been made. At T0, the levels of Vin_53, Vout_53, Vclamp, Vprot, Vprot1 and Vprot2 ramp proportionally. As Vin_53 rises, and shortly after time T0, the level of gateP2, which controls whether regulator 240*b* is essentially on or off, will jump to a voltage equivalent to Vin_53, leaving P2*b* off. With reference to FIG. 3, with Vin_53 is ramping to 3 volt and Vout_53 likewise ramping to 3 volt, a conflict between P7*b*, N18*b* and P3 occurs. Because Vout_53 is ramping to only 3 volt, and more slowly than Vin_53, and Vprot1 and Vprot2 (controlling N6*b* and N18*b*), P3 controlled by Vport2 will pull gateP2 high.

As Vin_53 ramps between time T0 and T1, only regulator 240*a* will be on. When the LV_53 signal is received and Vin_53 provides a 3 volt range input voltage, the regulator circuit allows Vin_53 to pass to Vout_53 via both P2*a* and P2*b* with low resistance. At time T1, Vin_53 will reach its peak and Vout_53 will slowly continue to rise until time T2. Vin_53 ramps to 3 volt, the clamp voltage Vclamp will roughly follow the input voltage Vin_53 until the LV-53 voltage goes high.

At time T1, LV_53 goes high, indicating that the input voltage is in the 3 volt range, which causes reactions in Vclamp, gateP, Vprot2, Vprot1, Vprot and gateP2. In the clamp circuit 220, P13 will shut off, driving Vprot1 and Vprot to ground. Vprot2 will remain high and be locked at its peak voltage. GateP and gateP2 will also fall to ground, turning on output transistors P2*a* and P2*b*.

GateP will be pulled down by N10 and N18*a*. VProt2 enables N18*a* and N10 to conduct, such that N10 and N18*a* pull gateP to ground though N10. This, in turn, turns on P2*a* which passes the Vin_53 to the regulator output.

At time T0, regulator 240*b* is off since the node at gateP2 is high, shutting off P2*b*. However, at T1, when LV_53 goes high, Vprot1 will shut off N6*b*, and Vprot2 will enable N18*b* and shut off P3. LV_53 enables N8*b* and gateP2 is pulled to ground, enabling P2*b*. Vprot1 at ground will shut off N6*b*, and Vprot2 at 3 volt will enable N18*b* and shut off P3. Hence, the node gateP2 is pulled to ground via N18*b* and N8*b* to ground and P2*b* passes the 3 volt Vin_53 input to Vout_53. This is graphically illustrated by the arrows 402 in FIG. 4.

FIGS. 3 and 5 illustrate regulation mode. Initially, both regulators are on since Vin_53 is ramping to 5 volt in the same time frame. In regulator 240*b*, in the fight between P7*b*, N18*b* and P3, device P13 is on, shorting the connection between Vprot1 and Vprot2, gateP2 will be held lower, (as evidenced by its longer rise time and lower magnitude in FIG. 5), hence P2*b* conducts. Because Vprot1 and Vprot2 are also ramping faster, they allow N6*b* and N18*b* to conduct, and restricting P3 from pulling the voltage at gateP2 high quickly. At time T1, as no LV_53 signal is provided, the output voltage Vout_53 shuts off P7*b*, preventing N18*b* and N6*b* from pulling gateP2 to a voltage level below 2.1 volts. Given the construction of the P2*b* device, the device will conduct at a level below a range of about 2.1-2.7 volts.

As Vout_53 rises, it will shut off the path to ground through P7*b* for P2*b*, and the voltage at gateP2 will be pulled high (up to the 5 volt range), shutting off P2*b* and regulator 240*b*. Regulator 240*a* thus provides the step down for the 5 volt voltage across output device P2*a*. Device P2*a* is sized so that the voltage drop across the device in 5 volt mode provides a stable output voltage in the 3 volt range.

As noted above, 3 volt devices are used in the regulators. In regulation mode, the protection circuit 275 controls the ramping at gateP, and hence protects the gate-to-drain, and gate-to-source voltages of transistor P2*a*. In a case where the input voltage Vin_53 and the protection voltages Vprot and Vprot2 ramp up very quickly, the node at gateP will also rise quickly since transistor N6*a* and N18*a* will be on and along with the p-channel transistor P7*a*. P7*a* will shut off as Vout_53 reaches P7's maximum rated threshold.

GateP must remain below the maximum rated voltage of P2*a* until the regulated output of 3 volts at Vout_53 is reached. As gateP ramps to 1.6v, its rise time will be hindered by the path of N8*a* and P7*a*. Because this path is on, it will hold down gateP. Hence, during a condition where no load is present on Vout, the presence of N18*a* and P7*a* insure that the load at gateP will not be pulled to the high voltage rail before the output voltage reaches its desired level. Once the output reaches 3.3 volts, P7a shuts off and gateP is allowed to continue to rise. With gateP at approximately 4.9 volts, the voltage between the gate and drain will still be only 1.3 volts.

In the case where the output voltage rises more slowly, the conduction path between gateP and the negative rail will again be allowed to continue until the maximum rated voltage of transistor P7a is achieved. A potential problem with this situation is that gateP cannot remain too low without risking damage to the gate-source interface. N6 allows the voltage at gate P to hold at 1.7 volts after the conduction path of P7 is terminated. Nevertheless, the voltage between the source of transistor P2 and gateP will never exceed 3.6 volts.

In circuit 240b, N8b since Vprot1 and Vprot2 follow Vin_53, and provide outputs between Vin_53 and ground, to ensure that the gate-to-drain voltages of P3, N6b and N18b will not exceed operating range for these devices. As noted above, gate P2 never sees a full 5 volt swing. While a true 5 volt signal is needed to shut off P2b, as long as gate P2 goes below 2.1-2.7 volts, P2b can be turned on. Hence, a "dynamic" 5 volt signal is created at gate P2—a true 5 volt signal is needed to fully shut off the device, but a signal less than 2.1 volts will shut off the device. Once Vout_53 goes high, it shuts off P7b, allowing P3 to pull gate P2 high. Since gate P2b never goes to ground, this protects the output transistor P2b Hence, all elements of the circuit of the present invention are protected from having voltages exceeding their maximum rated voltages either in a punch-through phase, or in a configuration stressing the gate to drain or gate to source coupling of the devices. In this manner, devices will not be damaged.

The invention provides the advantage that the technology which is utilized to fabricate the semiconductor devices in the peripheral device being manufactured for use with a host computer system can be utilized to construct the voltage regulator. Previously, were a voltage regulator requiring a step-down from, for example, 5 volts to 3 volts to be utilized, the voltage regulator would use 5 volt maximum rated voltage devices requiring separate masking and processing steps to fabricate the 5 volt devices along with the 3 volt devices which are utilized to manufacture the peripheral device. In the context of the present invention, the same technology can be utilized. The invention has particular applicability with respect to the use in non-volatile memories where the regulator voltage provided on the same semiconductor substrate as a memory device. However, the regulator is not so limited. The regulator has broad applicability with respect to any technology or in step-down voltage regulator manufactured out of devices having lower tolerances than, the input voltage would tend to allow are required.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A step down voltage regulator comprising devices designed to operate at a maximum device voltage lower than a supply voltage, comprising:

an output regulation device coupled to the supply voltage and an output;

an output device protection circuit responsive to the supply voltage and the output to ensure that the maximum device voltage of the output regulation device is not exceeded; and a bypass circuit having a bypass output device and being coupled to the supply voltage, the bypass circuit including protection circuitry to ensure that the maximum device voltage of the bypass output device is not exceeded, the bypass circuit enabled when the supply voltage is at said maximum device voltage and disabled above the maximum device voltage.

2. The regulator of claim 1 wherein the output regulation device comprises a p-channel transistor.

3. The regulator of claim 2 wherein the p-channel transistor has an operating maximum rated voltage in a range of 2.7-3.6 volts and the supply voltage is in a range of 4.4-5.25 volts.

4. The regulator of claim 2 wherein the output device protection circuit includes a gate-source protection component.

5. The regulator of claim 2 wherein the output device protection circuit includes a gate-drain protection component.

6. The regulator of claim 2 wherein the bypass output device is a p-channel transistor having a lower output resistance than said output regulation device.

7. The regulator of claim 6 wherein the bypass output device is several times greater in size than the output regulation device.

8. The regulator of claim 1 further including a voltage detector outputting a signal indicating whether the supply voltage is at said maximum device voltage or a greater voltage.

9. The regulator of claim 8 wherein said output device protection circuit and said bypass circuit are coupled to said signal.

10. The regulator of claim 9 wherein said bypass circuit is enabled or disabled based on said signal.

11. The regulator of claim 9 wherein said output protection circuit and said protection circuitry are enabled by said signal.

12. A voltage regulator supplying an output voltage lower than a supply voltage, comprising:

a first output device and a second output device, each designed to operate at a maximum rated voltage lower than the supply voltage;

protection circuitry coupled to the first output device and the second output device regulating, the protection circuitry regulating a gate voltage of the first output device and a second gate voltage of the second output device relative to a drain load and a source voltage on the first output device and a drain load and a source voltage on the second output device so as to not exceed the maximum rated voltage;

a voltage detector coupled to the supply voltage and at least the second output device, enabling the second output device when the supply voltage is at a voltage less than a maximum operating voltage for the first and second output devices.

13. The regulator of claim 12 wherein the output devices comprise p-channel transistors.

14. The regulator of claim 13 wherein the p-channel transistors have an operating maximum rated voltage in a range of 2.7-3.6 volts and the supply voltage is in a range of 4.4-5.25 volts.

15. The regulator of claim 12 wherein the second output device is a p-channel transistor having a lower output resistance than said first output device.

16. The regulator of claim 15 wherein the second output device is approximately three times greater in size than the first output device.

17. The regulator of claim 12 wherein the voltage detector outputs a signal indicating whether the supply voltage said maximum operating voltage or a greater voltage.

18. The regulator of claim 12 wherein said protection circuitry is coupled to said signal.

19. A memory system including a control path and a data path to a host device, and receiving a supply voltage from the host device, comprising:
    a voltage regulator including
        a voltage input coupled to the supply voltage;
        an output device having a maximum device operating voltage less than a maximum possible supply voltage and coupled to a regulator output; p2 a bypass device having the maximum device operating voltage and coupled to the regulator output;
        a protection circuit coupled to the voltage input, the bypass device and the output device, the protection circuit comprising a plurality of output control devices operating at maximum rated voltages less than the voltage provided by the host at the input; and
        a voltage detector coupled to the supply voltage outputting a signal indicating whether a level of the supply voltage exceeds the maximum device voltage; and
        wherein said bypass circuit is enabled or disabled based on said signal.

20. The memory system of claim 19 wherein the output device and the bypass device comprise a p-channel transistors.

21. The memory system of claim 20 wherein the p-channel transistors have an operating maximum rated voltage in a range of 2.7-3.6 volts and the supply voltage is in a range of 4.4-5.25 volts.

22. The regulator of claim 19 wherein the bypass device is a p-channel transistor having a lower output resistance than said output regulation device.

23. The regulator of claim 22 wherein the bypass output device is several times greater in size than the output regulation device.

24. A peripheral device for a host system including a voltage regulator circuit, comprising:
    a functional component;
    a voltage regulator having an output regulation device and a bypass device coupled to the supply voltage and an output supply voltage input and an output;
    an output device protection circuit responsive to the supply voltage and the output to ensure that the maximum rated voltage of the output regulation device is not exceeded; and
    a bypass circuit having including protection circuitry enabled when the supply is at said maximum rated voltage;
    wherein the functional component is a memory system.

25. The peripheral device of claim 24 wherein the memory system includes a controller and a memory array.

26. The peripheral device of claim 24 wherein the memory system is a pc card.

27. The peripheral device of claim 24 wherein the memory system is compact flash card.

28. The peripheral device of claim 24 wherein the memory system is a secure digital card.

29. The peripheral device of claim 24 wherein the memory system is a smart media card.

30. The peripheral device of claim 24 wherein the memory system is a memory stick.

31. The peripheral device of claim 24 wherein the memory system is a USB flash drive.

32. A memory system, comprising:
    a controller;
    a memory array; and
    a voltage regulator including a plurality of devices operating at maximum rated voltages less than a supply voltage and having an output regulation device coupled to the supply voltage and an output;
    an output device protection circuit responsive to the supply voltage and the output to ensure that the maximum rated voltage of the output regulation device is not exceeded; and
    a bypass circuit having a bypass output device and being coupled to the supply voltage, the bypass circuit including protection circuitry to ensure that the maximum device voltage of the bypass output device is not exceeded, the bypass circuit enabled when the supply voltage is at said maximum rated voltage and disabled above said maximum device voltage.

33. A peripheral device, comprising:
    a universal serial bus interface;
    a memory array having an input operating voltage; and
    a voltage regulator including an output regulation device coupled to the supply voltage and the memory array, the voltage regulator including
        an output device protection circuit responsive to the supply voltage to ensure that a maximum operating voltage of the output regulation device is not exceeded; and
        a bypass circuit having a bypass output device coupled to the memory array, the circuit being coupled to the supply voltage, the bypass circuit including protection circuitry to ensure that the maximum device voltage of the bypass output device is not exceeded, the bypass circuit enabled when the supply is at said maximum voltage and disabled above said maximum device voltage.

* * * * *

UNITED STATES PATENT AND TRADEMARK OFFICE
CERTIFICATE OF CORRECTION

PATENT NO. : 7,391,193 B2
APPLICATION NO. : 11/042610
DATED : June 24, 2008
INVENTOR(S) : Wang et al.

Page 1 of 1

It is certified that error appears in the above-identified patent and that said Letters Patent is hereby corrected as shown below:

Col. 11, line 19: After "output;" and before "a" delete "p2".

Signed and Sealed this

Twenty-eighth Day of October, 2008

JON W. DUDAS
*Director of the United States Patent and Trademark Office*